United States Patent [19]

Chakradhar et al.

[11] Patent Number: 6,145,106

[45] Date of Patent: Nov. 7, 2000

[54] STATE RELAXATION BASED SUBSEQUENCE REMOVAL METHOD FOR FAST STATIC COMPACTION IN SEQUENTIAL CIRCUITS

[75] Inventors: Srimat Chakradhar, North Brunswick; Michael S. Hsiao, Highland Park, both of N.J.

[73] Assignee: NEC USA Inc., Princeton, N.J.

[21] Appl. No.: 09/001,543

[22] Filed: Dec. 31, 1997

[51] Int. Cl.[7] .................................................. G01R 31/28

[52] U.S. Cl. ........................................................ 714/742

[58] Field of Search ................................... 714/738, 741, 714/742

[56] References Cited

PUBLICATIONS

Pomeranz et al, "Verse: A Vector Replacement Procedure for Improving Test Compaction in Synchronous Sequential Circuita", 1999 IEEE, pp. 250–255, Jul. 1999.
Bommu et al, "Vector restoration using accelerated validation and refinement", 1998 IEEE, pp. 458–466, Sep. 1998.
Hsiao et al., "Fast Static Compaction Algorithms for Sequential Circuit Test Vectors", IEEE Transactions On Computers, vol. 48, No. 3, Mar. 1999, pp. 311–322.
Pomeranz et al., "An Approach for Improving the Levels of CXompaction Achieved by Vector Omission", 1999 IEEE, pp. 463–466.
Higami et al, "Static Test Compaction for IDDQ Testing of Sequential CIrcuits", 1998 IEEE, pp. 9–13, 1999.

*Primary Examiner*—Hoa T. Nguyen
*Attorney, Agent, or Firm*—Sughrue, Mion, Zinn, Macpeak & Seas, PLLC

[57] ABSTRACT

A method for fast static compaction in sequential circuits with finite output states by removing subsequences of test vectors from a vector test set. The method has the following steps: (1) relaxing the output states of the sequential circuits; (2) identifying a candidate subsequence of test vectors from the vector test set for removal; (3) temporarily removing the candidate subsequence of test vectors from the vector test set; (4) performing fault simulation on remaining test vectors from the vector test set; (5) examining fault simulation results against a set of removal criteria; (6) permanently removing the temporarily removed candidate subsequence if said set of removal criteria are met; (7) replacing the temporarily removed candidate subsequence if said set of removal criteria are not met; and (8) repeating steps (1) through (7) until all candidate subsequences of test vectors have been identified.

6 Claims, 9 Drawing Sheets

FIG. 1

NUMBER OF STATES TRAVERSED BY HITEC TEST SETS

| CIRCUIT | VEC | STATES | CIRCUIT | VEC | STATES |
|---------|------|--------|---------|------|--------|
| s298    | 292  | 137    | s832    | 1136 | 24     |
| s344    | 127  | 113    | s1196   | 435  | 294    |
| s382    | 2074 | 646    | s1238   | 475  | 332    |
| s400    | 2214 | 690    | s1423   | 150  | 150    |
| s444    | 2240 | 592    | s1488   | 1170 | 47     |
| s526    | 2258 | 625    | s1494   | 1245 | 47     |
| s641    | 209  | 103    | s5378   | 912  | 912    |
| s713    | 173  | 85     | 235932  | 496  | 381    |
| s820    | 1114 | 24     |         |      |        |

VEC: TEST SET SIZE
STATES: # STATES TRAVERSED

FIG. 2

FAULT-EFFECTS ENTERING AND EXITING A
SUBSEQUENCE IDENTICAL

FIG. 3(a)

FAULT-EFFECTS ENTERING AND EXITING A
SUBSEQUENCE DIFFERENT

FIG. 3(b)

FAULT-FREE STATE RELAXING

FIG. 5(a)

FAULT-MASKING AFTER REMOVING SUBSEQUENCE

| | TEST VECTOR | OUTPUT STATE | RELAXED STATE | OUTPUT STATE FAULT 1 | OUTPUT STATE FAULT 2 | OUTPUT STATE FAULT 3 | OUTPUT STATE FAULT 4 | OUTPUT STATE FAULT 5 |
|---|---|---|---|---|---|---|---|---|
| 1. | 0000 | 00 | 00 | 00 | 00 | 00 | 00 | 00 |
| 2. | 1100 | 01 | 01 | 01 | 01 | 01 | 01 | 01 |
| 3. | 1111 | 10 | 10 | 10 | 10 | 11 | 11 | 10 |
| 4. | 0101 | 00 | 11 | 11 | 11 | 01 | 11 | 11 |
| 5. | 0001 | 00 | 0X | 0X | 0X | 10 | 0X | 00 |
| 6. | 0111 | 01 | 00 | 00 | 00 | 00 | 1X | 00 |
| 7. | 0000 | 11 | XX | XX | 11 | XX | XX | XX |
| 8. | 0000 | 10 | 11 | X1 | 11 | 11 | 11 | 11 |
| 9. | 1100 | 11 | 10 | 11 | 10 | 10 | X1 | 00 |
| 10. | 1001 | 01 | 11 | X1 | X1 | X1 | 11 | 11 |
| 11. | 0110 | 10 | 10 | 10 | 10 | 10 | 10 | X1 |
| 12. | 0011 | 11 | 11 | 11 | 00 | 11 | 11 | 10 |
| 13. | 1111 | 11 | X1 | X1 | 11 | 01 | X1 | 11 |
| 14. | 0111 | 11 | 11 | 11 | 11 | 11 | 11 | X1 |
| 15. | 1010 | | | | | | | 11 |

FIG. 6(b)

| | TEST VECTOR | OUTPUT STATE | RELAXED STATE | OUTPUT STATE FAULT 1 | OUTPUT STATE FAULT 2 | OUTPUT STATE FAULT 3 | OUTPUT STATE FAULT 4 | OUTPUT STATE FAULT 5 |
|---|---|---|---|---|---|---|---|---|
| 1. | 0000 | 00 | 00 | 00 | 00 | 00 | 00 | 00 |
| 14. | 0111 | 11 | X1 | X1 | [00] | X1 | X1 | X1 |
| 15. | 1010 | 11 | 11 | 11 | 11 | 11 | 11 | 11 |

FIG. 6(c)

| | TEST VECTOR | OUTPUT STATE | RELAXED STATE | OUTPUT STATE FAULT 1 | OUTPUT STATE FAULT 2 | OUTPUT STATE FAULT 3 | OUTPUT STATE FAULT 4 | OUTPUT STATE FAULT 5 |
|---|---|---|---|---|---|---|---|---|
| 1. | 0000 | 00 | 00 | 00 | 00 | 00 | 00 | 00 |
| 13. | 1111 | 11 | X1 | X1 | X1 | X1 | X1 | X1 |
| 14. | 0111 | 11 | X1 | X1 | 00 | X1 | X1 | X1 |
| 15. | 1010 | 11 | 11 | 11 | 11 | 11 | 11 | 11 |

FC: FAULT COVERAGE IN %
VEC: TEST SET LENGTH
%R: PERCENTAGE OF TEST SET LENGTH REDUCED
TIME: EXECUTION TIME IN SECONDS

FIG. 7

GREATEST REDUCTIONS HIGHLIGHTED IN BOLD

COMPACTION RESULTS FOR HITEC TEST SETS

| CIRCUIT | TOTAL FAULTS | ORIGINAL | | | NO-RELAXATION | | | RELAXATION | | |
|---|---|---|---|---|---|---|---|---|---|---|
| | | FC | VEC | | FC | %R | TIME | FC | %R | TIME |
| s298 | 308 | 86.0 | 292 | | 86.0 | 11.0 | 0.3 | 86.0 | 11.0 | 0.4 |
| s344 | 342 | 95.9 | 127 | | 95.9 | 4.72 | 1.2 | 95.9 | 28.4 | 1.3 |
| s382 | 399 | 78.2 | 2074 | | 78.2 | 61.5 | 34.0 | 78.2 | 62.0 | 35.0 |
| s400 | 426 | 82.6 | 2214 | | 82.6 | 52.9 | 46.3 | 82.6 | 53.8 | 47.5 |
| s444 | 474 | 82.1 | 2240 | | 82.1 | 55.2 | 60.0 | 82.1 | 59.0 | 68.0 |
| s526 | 555 | 65.1 | 2258 | | 65.1 | 20.4 | 54.8 | 65.1 | 20.4 | 59.2 |
| s641 | 467 | 86.5 | 209 | | 86.5 | 27.3 | 3.7 | 86.4 | 35.9 | 4.0 |
| s713 | 581 | 81.9 | 173 | | 81.9 | 17.9 | 3.6 | 81.7 | 27.8 | 3.8 |
| s820 | 850 | 95.7 | 1114 | | 95.5 | 45.9 | 58.0 | 95.6 | 48.6 | 68.8 |
| s832 | 870 | 93.9 | 1136 | | 94.0 | 46.8 | 70.9 | 93.7 | 48.7 | 80.7 |
| s1196 | 1242 | 99.8 | 435 | | 99.8 | 1.15 | 33.6 | 99.6 | 22.8 | 44.5 |
| s1238 | 1355 | 94.7 | 475 | | 94.7 | 2.32 | 30.8 | 93.7 | 28.0 | 70.4 |
| s1488 | 1486 | 97.2 | 1170 | | 97.0 | 7.95 | 14.0 | 97.0 | 34.2 | 106 |
| s1494 | 1506 | 96.5 | 1245 | | 96.3 | 8.67 | 14 | 96.3 | 42.7 | 140 |
| s35932 | 39094 | 89.3 | 496 | | 89.3 | 4.44 | 6818 | 89.3 | 40.0 | 9274 |
| am2910 | 2391 | 91.6 | 1973 | | 91.6 | 0.05 | 33.5 | 91.1 | 4.2 | 240 |
| mult16 | 1708 | 92.6 | 111 | | 92.6 | 0.00 | 1.9 | 92.6 | 1.4 | 9.7 |
| div16 | 2147 | 78.0 | 238 | | 78.0 | 5.46 | 7.6 | 78.0 | 7.98 | 12.9 |

FIG. 8

COMPACTION RESULTS FOR STRATEGATE TEST SETS

GREATEST REDUCTIONS HIGHLIGHTED IN BOLD

| CIRCUIT | ORIGINAL | | NO-RELAXATION | | | RELAXATION | | |
|---|---|---|---|---|---|---|---|---|
| | FC | VEC | FC | %R | TIME | FC | %R | TIME |
| s298 | 85.7 | 306 | 85.7 | 0.00 | 2.3 | 85.7 | 7.73 | 2.5 |
| s344 | 96.2 | 86 | 96.2 | 8.1 | 1.2 | 96.2 | 25.6 | 1.4 |
| s382 | 91.2 | 1486 | 91.2 | 62.2 | 12.1 | 91.0 | 70.5 | 14.3 |
| s400 | 90.1 | 2424 | 90.1 | 63.7 | 20.1 | 89.9 | 71.1 | 24.7 |
| s444 | 89.5 | 1945 | 89.5 | 60.1 | 19.9 | 89.2 | 67.8 | 22.8 |
| s526 | 81.8 | 2642 | 81.8 | 37.0 | 38.6 | 81.6 | 40.2 | 45.6 |
| s641 | 86.5 | 166 | 86.5 | 19.3 | 2.9 | 86.4 | 27.7 | 3.3 |
| s713 | 81.9 | 176 | 81.9 | 18.2 | 2.9 | 81.6 | 27.7 | 3.6 |
| s820 | 95.8 | 590 | 95.8 | 23.2 | 18.0 | 95.5 | 37.0 | 25.5 |
| s832 | 94.0 | 701 | 94.0 | 30.0 | 18.9 | 93.7 | 42.8 | 33.7 |
| s1196 | 99.8 | 574 | 99.5 | 3.66 | 22.6 | 99.1 | 46.9 | 34.4 |
| s1238 | 94.6 | 625 | 94.5 | 8.64 | 20.0 | 93.6 | 49.9 | 42.8 |
| s1423 | 93.3 | 3943 | 93.3 | 38.1 | 72.1 | 93.3 | 61.3 | 213 |
| s1488 | 97.2 | 593 | 97.1 | 24.1 | 45.1 | 97.0 | 34.2 | 107 |
| s1494 | 96.5 | 540 | 96.4 | 13.3 | 20.7 | 96.3 | 22.8 | 39.8 |
| s5378 | 79.1 | 11481 | 79.1 | 9.09 | 673 | 79.1 | 10.9 | 753 |
| s35932 | 89.8 | 257 | 89.8 | 15.6 | 5198 | 89.8 | 15.6 | 5211 |
| am2910 | 91.9 | 2509 | 91.9 | 13.1 | 105 | 91.8 | 63.7 | 137 |
| mult16 | 97.5 | 1530 | 97.4 | 68.1 | 80.2 | 97.6 | 73.6 | 90.3 |
| div16 | 84.7 | 3476 | 84.7 | 46.9 | 63.9 | 84.7 | 46.9 | 67.4 |
| pcont2 | 60.5 | 194 | 60.5 | 39.4 | 202 | 60.5 | 45.1 | 226 |

FC: FAULT COVERAGE IN %
VEC: TEST SET LENGTH
%R: PERCENTAGE OF TEST SET LENGTH REDUCED
TIME: EXECUTION TIME IN SECONDS

STATE RELAXATION BASED SUBSEQUENCE REMOVAL METHOD FOR FAST STATIC COMPACTION IN SEQUENTIAL CIRCUITS

BACKGROUND OF THE INVENTION

1. Field of the Invention

This invention relates to a method for compacting test sets for sequential circuits. More specifically, to a state relaxation based subsequence removal method for fast static compaction in sequential circuits.

This application relates to U.S. application Ser. No. 09/001,542 filed on Oct. 31, 1997 entitled, "Partitioning and Recording Methods for Static Test Sequence Compaction of Sequential Circuits," which is assigned to the Assignee of the present invention and which is incorporated herein by reference.

2. Background and Description of Related Art

Test application time (TAT) of sequential circuits is proportional to the number of test vectors in a test set and directly impacts the cost of testing. Thus, shorter test sequences are desired. Two types of compaction techniques exist: dynamic and static compaction. Dynamic techniques perform compaction concurrently with the test generation process and often require modification of the test generator. Static test sequence compaction, on the other hand, is a post-processing step after test generation. Static techniques are independent of the test generation algorithm and require no modification of the test generator. Even if dynamic compaction is performed during test generation, static compaction can further reduce the test set size obtained after test generation.

Several static compaction approaches for sequential circuits have been proposed in the following papers: Niermann, T. M., et al. "Test Compaction for Sequential Circuits," IEEE Trans. Computer-Aided Design, vol. 11, no. 2, pp. 260–67, February 1992, So, B., "Time-efficient Automatic Test Pattern Generation System," Ph.D. Thesis, EE Dept. Univ. of Wisconsin-Madison, 1994, Pomeranz, I., et al., "On Static Compaction of Test Sequences for Synchronous Sequential Circuits," Proc. Design Automation Conf., pp. 215–20, June 1996 and Hsiao, M. S. et al., "Fast Algorithms for Static Compaction of Sequential Circuit Test Vectors," Proc. IEEE VLSI Test Symp., pp. 188–195, April 1995.

Recent proposals include overlapping and reordering of test sequences obtained from targeting single faults to achieve compaction (Niermann and So). However, these approaches cannot be used on test sequences produced by random or simulation-based test generators.

Static compaction based on vector insertion, omission, or selection has also been investigated (Pomeranz). These methods require multiple fault simulation passes. They eliminate vectors from a test set without reducing the fault coverage that can be obtained using the original test set. When a vector is to be omitted or swapped, the fault simulator is invoked to make sure that the fault coverage is unaffected by the alteration to the test sequence. Very compact test sets can be achieved at the expense of prohibitively long execution times.

Figure 1:
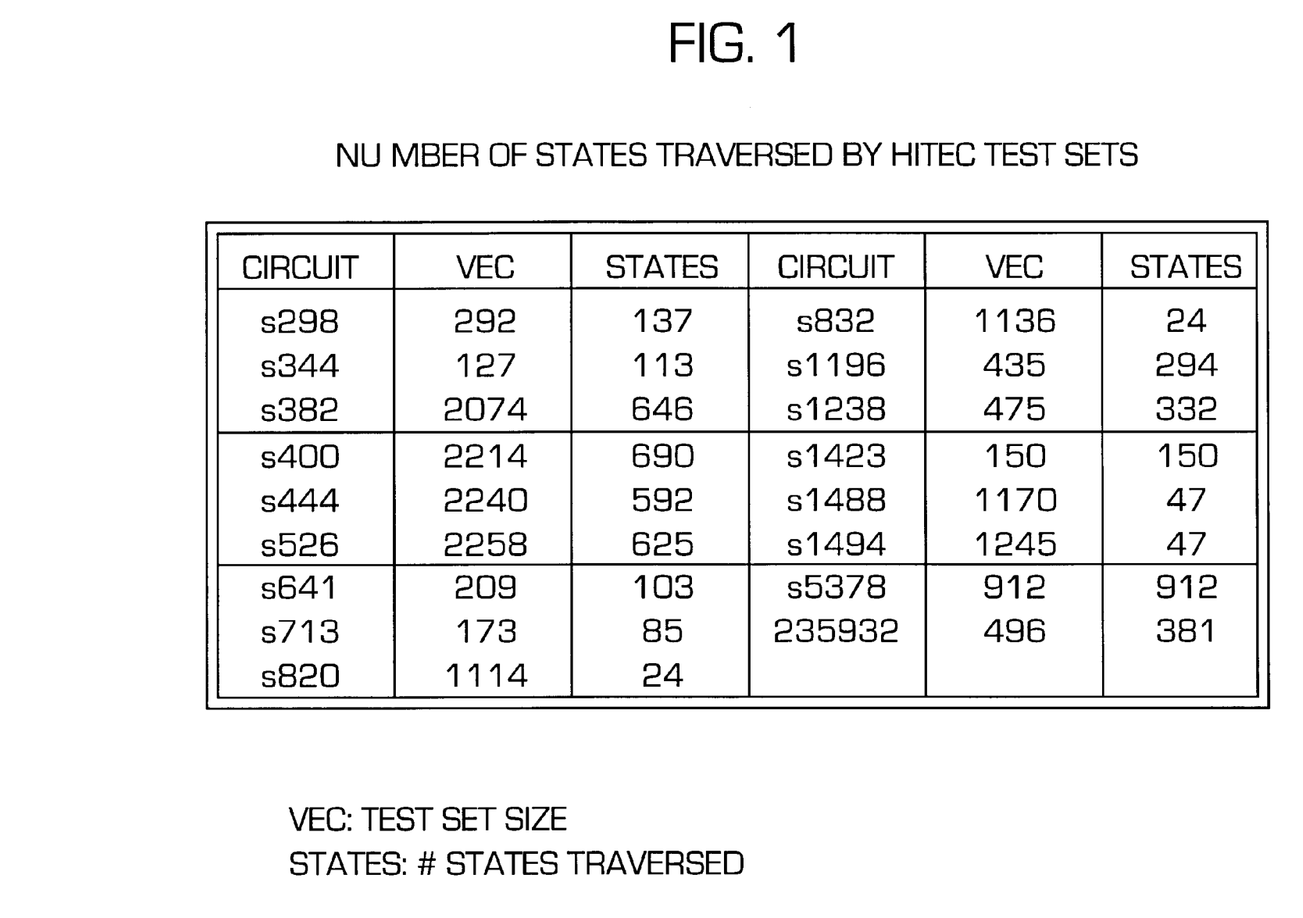
FIG. 1 is a table showing the number of states traversed by HITEC test sets.

A fast static compaction technique for sequential circuits based on removing subsequences of test vectors was reported recently (Hsiao). This approach is based on two observations: (1) test sequences traverse through a small set of states that are frequently re-visited, and (2) subsequences corresponding to cycles may be removed from a test set under certain conditions. However, if test sets have few or no states that are re-visited, then the subsequence removal algorithm performs poorly. FIG. 1 is a table showing the number of vectors and states traversed by the HITEC test sets for some ISCAS89 benchmark circuits. Information regarding these test sets and circuits can be found in the following papers: Niermann, T. M., et al., "HITEC: A Test Generation Package for Sequential Circuits," Proc. European Conf. Design Automation (EDAC), pp. 214–18, 1991, Niermann, T. M., et al., "Method for Automatically Generating Test Vectors for Digital Integrated Circuits," U.S. Pat. No. 5,377,197, 1994, and Brglez, F., et al., "Combinational Profiles of Sequential Benchmark Circuits," Int. Symposium on Circuits and Systems," pp. 1929–34, 1989. Similar trends are seen in test sets generated by other test generators.

SUMMARY OF THE INVENTION

Consider a test set T that has no state that is re-visited. Therefore, the test set has no cycles. Obviously, the subsequence removal algorithm reported in Hsiao will not be able to compact the test set. However, by using state relaxation, one can identify a subsequence that may be removed. For example, assume that the test set T transfers a finite state machine from state $S_{initial}$ to $S_{final}$ without repeating any states. If $T_{sub}$ is a subsequence of test set T that transfers the finite state machine from state $S_i$ to state $S_j$, states $S_i$ and $S_j$ must be different since the test set has no cycles. It is possible that not all specified values in state $S_i$ are essential to reach state $S_j$ using subsequence $T_{sub}$. Therefore, state $S_i$ can be relaxed by unspecifying the non-essential bits in state $S_i$. Similarly, not all bits in state $S_j$ need to be specified in order to transfer the machine to state $S_{final}$.

Without loss of generality, assume that $S_i$ and $S_j$ are 10110 and 00100, respectively. Assuming that state $S_j$ can be relaxed to X01X0, then the first and the fourth state bits (flip-flop values) are unspecified. State relaxation ensures that if $T_{sub}$ is removed from the test set, then it will still be possible to transfer the machine to the state $S_{final}$ using the modified sequence. Removal of a subsequence $T_{sub}$ means that vectors $V_i \ldots V_{j-1}$ will be removed from test set T. Note that the last vector (vector $V_j$) of subsequence $T_{sub}$ is still part of the test set. Stated differently, the relaxed $S_j$ now covers state $S_i$, and the subsequence $T_{sub}$ has created a cycle that may be removed to achieve compaction.

Relaxation of states can be computed efficiently using a support-set algorithm, such as the one described in the paper by A. Raghunathan, entitled, "Acceleration Techniques for Dynamic Vector Compaction," Proc. Intl. Conf. Computer-Aided Design, pp. 310–17, 1995. Support-sets can be computed in linear time and space complexity, thus making the relaxation approach very feasible. If the test set has cycles, then state relaxation can be used to find larger cycles. The size of a cycle is the number of vectors in the subsequence causing the cycle.

The basic steps of the invention are to: (1) relax the output states of the machine; (2) identify a candidate recurrent subsequence for removal; (3) perform a fault simulation analysis to determine if the subsequence can be removed; (4) remove the subsequence and/or identify the next candidate recurrent subsequence for removal.

The present invention has several advantages. Test sets that could not be compacted by existing subsequence removal techniques due to absence of cycles can now be compacted. The size of cycles in a test set can be significantly increased by state relaxation, and removal of the larger sized cycles leads to better compaction. The invention requires only two fault simulation passes as compared to trial and re-trial methods that require multiple fault simulation passes. significantly higher compaction is achieved in short execution times as compared to currently known subsequence removal methods. Experiments on ISCAS89 sequential benchmark circuits and several synthesized circuits show that the invention consistently results in significantly higher compaction in short execution times when compared with known subsequence removal methods.

DETAILED DESCRIPTION OF THE PREFERRED EMBODIMENTS

The preferred embodiments will be described below with reference to the figures and the following examples. Given a sequential circuit test vector set T consisting of n vectors $V_1 \ldots V_n$, the subsequence from the $i^{th}$ vector to the $j^{th}$ vector ($0 \leq i \leq j \leq n$) of T is represented as $T[V_i, V_{i+1}, \ldots, V_j]$. Here, $V_i$ and $V_j$ are the $i^{th}$ and $j^{th}$ vectors in the test vector set T, respectively. Key terms are described in the following paragraphs.

A recurrent subsequence ($T_{rec}$) transfers a finite state machine from a given initial state to the same state. Essentially, $T_{rec}$ re-visits the initial state of the finite state machine. This subsequence is responsible for traversing a cycle in the state diagram of the finite state machine.

A recurrent subsequence is an inert subsequence ($T_{inert}$) if no faults are detected within the subsequence during fault simulation, with fault dropping, of the test set T. Fault dropping means that as the test set is compacted, faults that are detected by test vectors that will remain in the final compacted test vector set are excluded from the pool of faults that must be detected by the remaining uncompacted test vectors. Inert subsequences can be removed from the test set without adversely affecting the fault coverage under certain conditions. See for example, Hsiao cited above.

Flip-flops that are assigned the don't care value of X are considered to be unspecified. If state $S_i$ is partially specified, then an exhaustive set of states can be obtained by enumerating don't care (unassigned) values of $S_i$. For example, state X01 is partially specified and it represents two states 001 and 101.

State $S_j$ covers state $S_i$ if the group of states represented by $S_i$ are a subset of states represented by $S_j$. For example, consider two states $S_1$ and $S_2$ that are represented by bit vectors X01 and 00X, respectively. State $S_1$ does not cover state $S_2$. This is because state $S_2$ represents two states 000 and 001 and state $S_1$ does not include the state 000. If states $S_1$ and $S_2$ are fully specified, then $S_1$ covers $S_2$ only when $S_1$ and $S_2$ are identical.

A flip-flop is relaxed if its value is changed from 0 or 1 to a don't care value X.

Consider states $S_i$, $S_j$ and their relaxations $S_i^R, S_j^R$. State $S_j^R$ strictly covers the relaxed state $S_i^R$ if $S_j^R$ covers unrelaxed state $S_i$. Note that $S_j^R$ may or may not cover $S_i^R$. For example, let $S_j^R$ be X01 and $S_i^R$ be 00X. $S_j^R$ does not cover $S_i^R$. However, if $S_i$ was 001 before relaxation, then $S_j^R$ covers $S_i$. Therefore, $S_j^R$ strictly covers $S_i^R$.

Consider two relaxed states $S_i^R$ and $S_j^R$. A relaxed recurrent subsequence $T_{relaxed\_rec}$ transfers a finite state machine from state to state $S_i^R$ to state $S_j^R$ such that $S_j^R$ strictly covers $S_i^R$.

A relaxed inert subsequence $T_{relaxed\_inert}$ is a relaxed recurrent subsequence if no faults are detected within the subsequence during fault simulation (with fault dropping) of the test set T.

Given a state $S_i$, its relaxation can be computed by deriving support sets. Methods for deriving support sets are well known. See for example, Raghunathan, A., et al., "Acceleration techniques for dynamic vector compaction," Proc. Intl. conf. Computer-Aided Design, pp. 310–17, 1995, which is incorporated herein by reference. Consider an input vector that produces a response v (0 or 1) at a primary output Z of a combinational circuit. The input vector may or may not be fully specified. A vector is not fully specified if some of the primary inputs are unspecified (these inputs are assigned the don't care value X). A support set of the primary output Z is any set of signals (including primary inputs) that satisfy all the following conditions:

SS1 All signals in the set assume a logic value 0 or 1 (i.e., no signal may assume the unknown value).

SS2 The primary output Z is a member of the set.

SS3 The logic value on any signal other than a primary input signal in the support set is uniquely determined only by logic values of other signals in the support set.

A support set is minimal if no signal in the set can be deleted without violating conditions SS2 or SS3. The minimum support set is the support set of least cardinality. The minimum support set is also minimal, but the converse is not true.

An input vector can cause several primary outputs of a circuit to assume known values. In the case of multiple primary outputs, condition SS2 is modified to require that each of the primary outputs be included in the support set. Support sets can be used to compute the set of flip-flop values in the present state that are sufficient to produce the desired next state for any given input vector.

Figure 2:
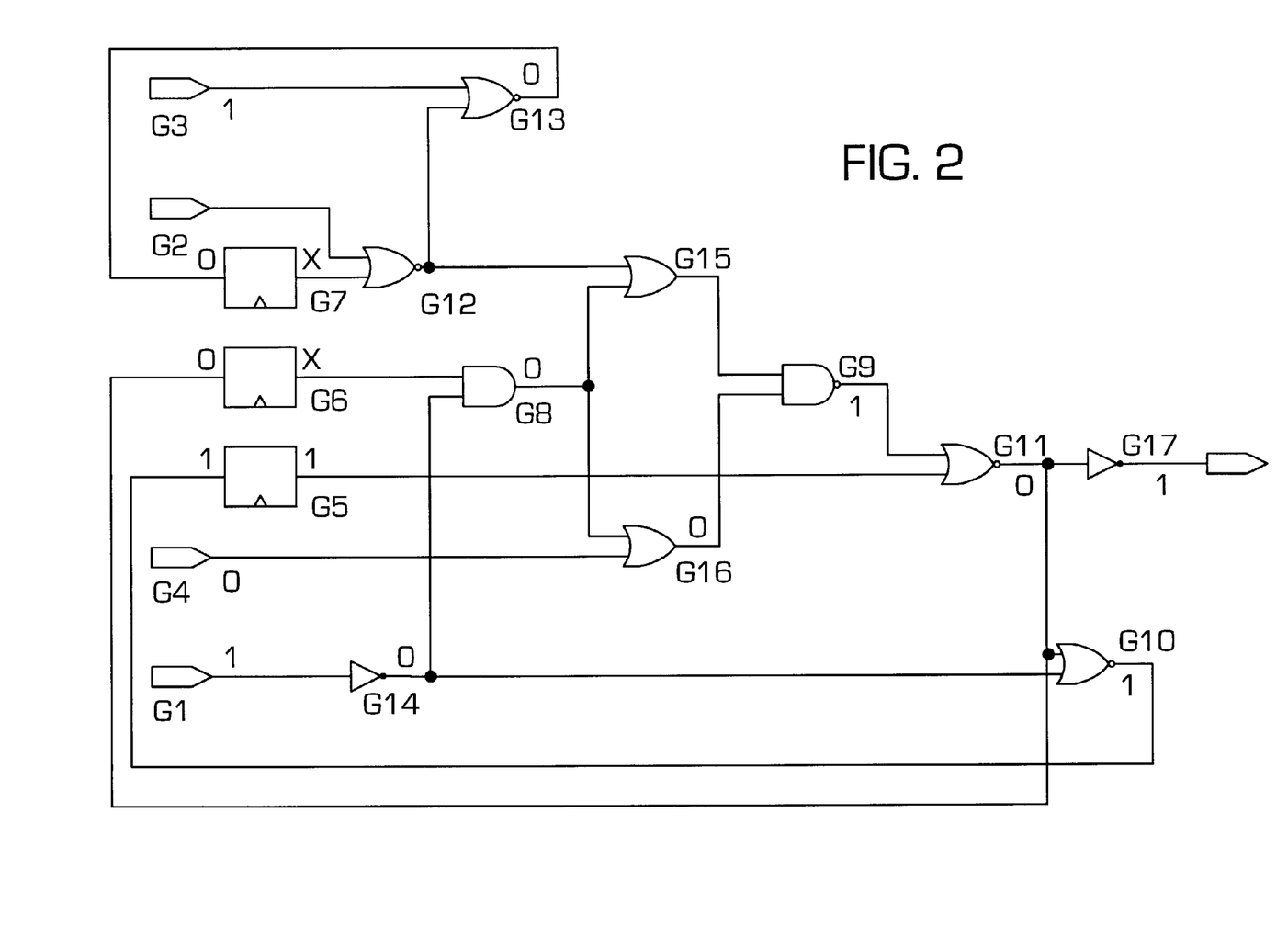
FIG. 2 is diagram of ISCAS89 sequential benchmark circuit s27.

Consider the ISCAS89 sequential benchmark circuit s27 shown in FIG. 2. This circuit has four primary inputs (G1, G2, G3 and G4), one primary output (G17) three flip-flops (G5, G6 and G7) and intermediate logic elements G4, G8, G9, G10, G11, G12, G13, G14, G15 and G16. Let inputs to the circuit be represented by the vector <G1, G2, G3, G4>. The state of the sequential circuit is given by the vector <G5, G6, G7>. If the initial state of the circuit is 100 and an input vector 1X10 is applied, the circuit produces an output value of 1. The input vector transfers the sequential circuit to the state 100. Logic simulation shows th at the same next-state and primary output value can also be obtained if the initial state of the machine were any one of the following three states: 101, 110 or 111. This example shows that for a given input vector, there may be several initial states that will transfer the sequential circuit to the same next-state and primary output values. The set of initial states for the example can be re presented succinctly by the state vector 1XX. This state is the relaxation of all four initial states.

State relaxation provides a significant advantage during fault simulation. A fault effect at a flip-flop with relaxed value cannot be propagated to any primary output or flip-flop. This is because a value of 0 or 1 on a relaxed flip-flop has no impact on primary outputs or next-state values. Consider again the example circuit s27 of FIG. 2. A fault-effect cannot be propagated on the relaxed flip-flop G7 to the primary output or flip-flops. This is because a controlling value G16=0 blocks propagation of a fault effect to the primary output or flip-flops G5 and G6, and a controlling value of G3=1 prevents propagation of a fault effect to the flip-flop G7.

State relaxation can be achieved using several approaches. Support sets are used to derive the relaxed state efficiently. Support set computation has a linear time and space complexity. Consider again the circuit s27 shown in FIG. 2. Signal (G3=1) alone is a support set for the assignment (G13=0). On the other hand, signals (G5=1, G9=1, G16=0, G4=0, G8=0, G14=0, G1=0) together form a possible support set for (G11=0).

Ideally, one should consider states for relaxation in reverse order of their appearance during logic simulation of test set T. This maximizes the number of relaxed flip-flop values. Consider a test set $T[V_1, \ldots, V_n]$ and let $S_i (1 \leq i \leq n)$ be the state of the machine when vector $V_i$ is simulated. States can be relaxed in the order $S_n \ldots S_1$ to maximize relaxed values. Since next-state values on flip-flops determine the extent of relaxation possible for the present state, it is useful to relax state $S_j$ first before considering all states $S_i$, $1 \leq i < j$. The cost of memory storage for reverse order relaxation, however, is extremely high. This requires storage of logic values of signal values for all vectors in test set T.

An alternative and less expensive approach is to relax states in the same order as they are visited during logic simulation of test set T. This means that each state is relaxed with respect to the fully-specified next-state, because the next-state has not yet been relaxed.

Iterative relaxation of states over the entire test set several times can further reduce the number of flip-flops in the support sets. The first iteration relaxes each state with respect to the fully-specified next-states, the second iteration further relaxes every state by computing corresponding support sets with respect to the already relaxed successive states computed in the first iteration, and so on. However, iterative relaxation of states increases execution times. Experimental results show that minimal support sets based on the successive fully-specified states are sufficient to significantly compact test sets.

A flip-flop has a fault effect if it has a different Boolean (0 or 1) value for the good and faulty circuit. If a flip-flop has a value of 1 (0) in the good circuit and a value of 0 (1) in the faulty circuit, this combination of values is represented as D ($\overline{D}$). Flip-flops can already have fault effects before the application of the first vector in the subsequence $T_{sub}$. Similarly, flip-flops can have fault effects after the application of the subsequence.

Figure 3A:
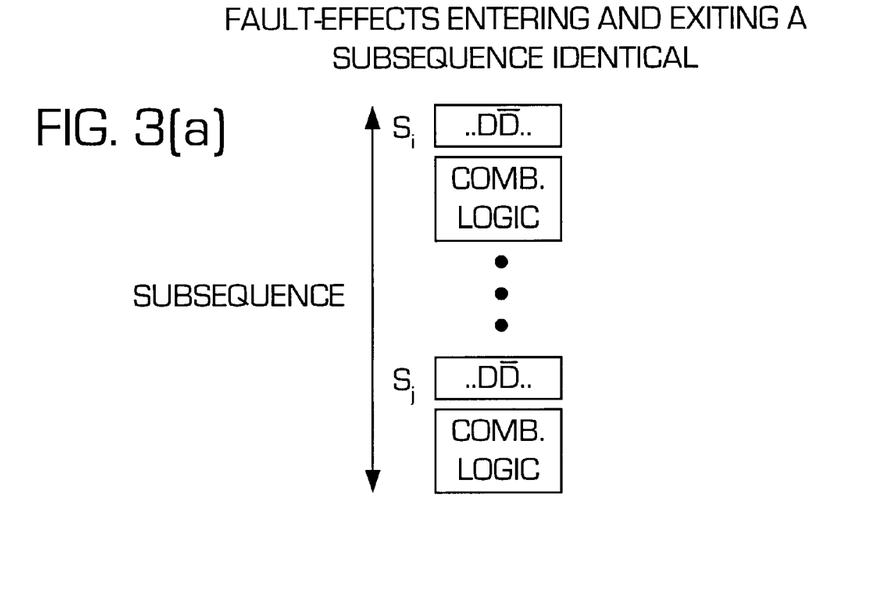
FIG. 3(a) is a diagram showing fault-effects entering and exiting a subsequence being identical.
Figure 3B:
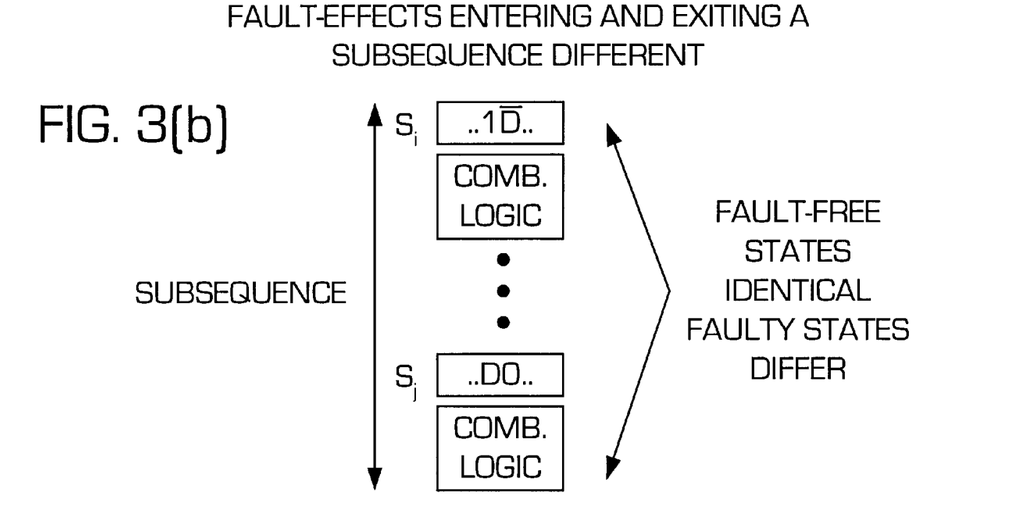
FIG. 3(b) is a diagram showing fault-effects entering and exiting a subsequence being different.

Consider an inert subsequence $T_{sub}$. This subsequence may be removed from the test set without any reduction in fault coverage under certain conditions. If fault-effects on flip-flops before and after the application of the inert subsequence are identical (see FIG. 3(a)), then the subsequence can be safely removed. However, it is possible that fault effects before and after the application of the subsequence may differ (see FIG. 3(b)). In this situation, further analysis is required before the subsequence can be removed.

For example, consider a flip-flop that has no fault effect before the application of the subsequence, however, it exhibits a fault effect after simulation of the subsequence. Removal of the subsequence is possible only if it can be established that the fault effect cannot be propagated to a primary output by the remaining vectors in test set T.

A recurrent subsequence can be removed if it satisfies (1) all conditions specified for an inert subsequence, and (2) faults detected within the subsequence can also be detected elsewhere in the test set T.

The basic subsequence removal algorithm is described below:

basic_subsequence_removal( )
    /* FIRST FAULT Simulation PASS */
    Collect recurrent & inert subsequences
    /* SECOND FAULT SIMULATION PASS */
    For each subsequence $T_{subi}$ collected
        If any of the removal criteria satisfied
            Remove $T_{subi}$ from the test set The algorithm consists of two passes. The first fault simulation pass is used to identify and collect inert and recurrent subsequences assuming a fault-free machine. The second fault simulation pass checks to see if inert and recurrent subsequences satisfy all conditions specified for the removal of the subsequences by analyzing machines with faults. The two-pass algorithm has significant storage savings since faulty states have to be recorded only in the second pass. Faulty states are recorded only at the boundaries of each inert or recurrent subsequence.

Figure 4:
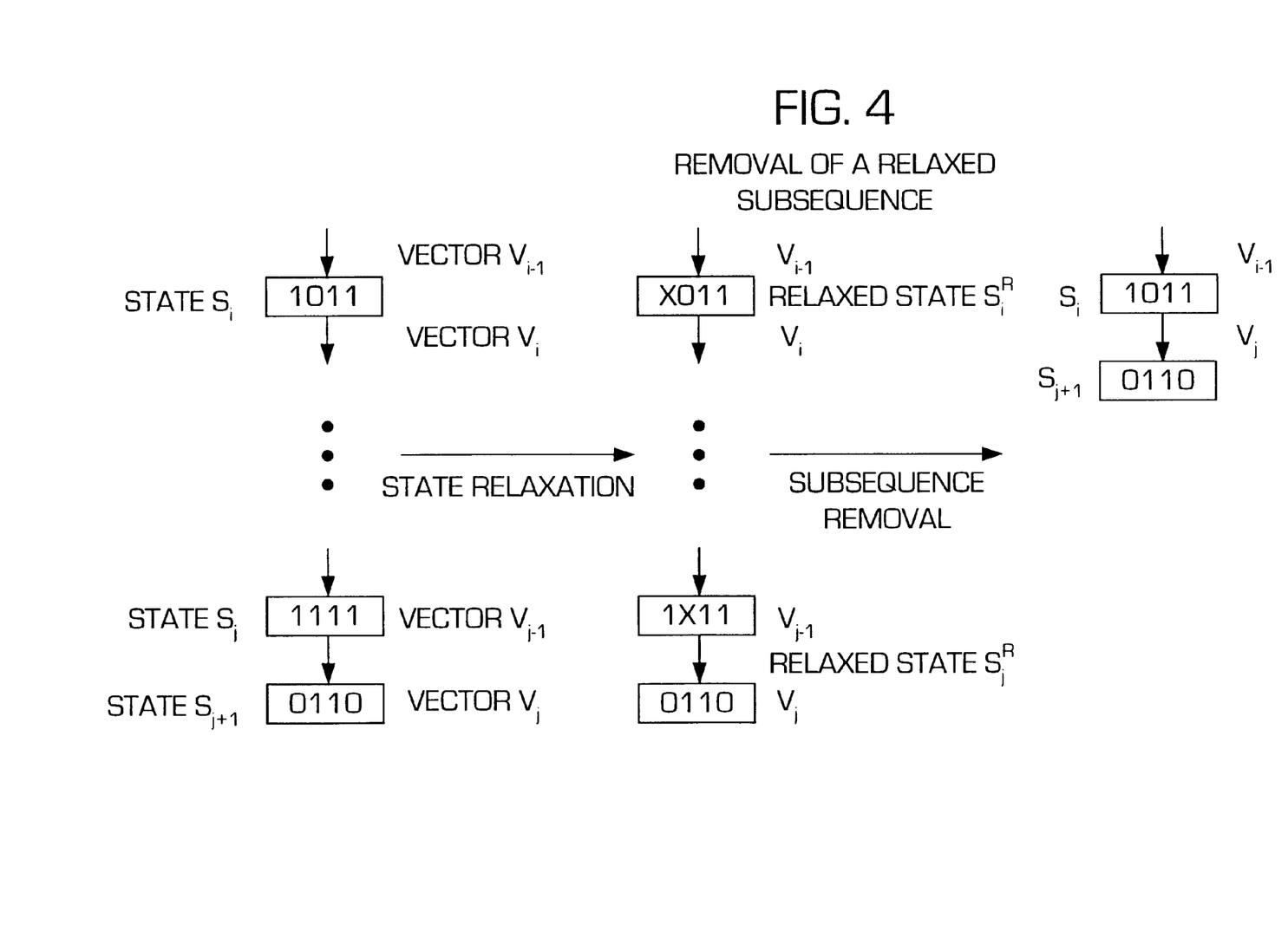
FIG. 4 is a diagram showing the removal of a relaxed subsequence.

Consider a subsequence $T_{sub}$ consisting of vectors $V_i \ldots V_j$. Let $S_i$ be the initial state of the machine when vector $V_i$ is simulated during logic simulation of the subsequence. Consider the case illustrated in FIG. 4, the subsequence $T_{sub}$ is not a recurrent subsequence because the initial state $S_i$ (1011) differs from the final state $S_{i+1}$ (0110) of subsequence $T_{sub}$. Assume that state relaxation allows the first flip-flop of state $S_i$ and second flip-flop value of state $S_j$ to be relaxed (i.e., relaxation of these flip-flops indicates that these flip-flop values are not necessary to reach the corresponding next-states $S_{i+1}$ or $S_{j+1}$, respectively). Note that the relaxed state $S_j^R$ strictly covers relaxed state $S_i^R$ since the unrelaxed value of the first flip-flop in $S_i$ is 1. If $T_{sub}$ were to be removed from the test set, state $S_{j+1}$ is still reachable by applying vector $V_{j+1}$ when the present state of the circuit is $S_i$ instead of $S_j$. If no faults are detected within $T_{sub}$, $T_{sub}$ is simply a relaxed inert subsequence, and its removal will not affect the fault coverage, provided that boundary conditions described in the detailed example below. Even if faults are detected within $T_{sub}$, $T_{sub}$ can still be removed if faults detected within the subsequence can also be detected by other vectors in the test sequence.

The relaxed subsequence removal technique also requires two fault simulation passes. In the first pass, fault-free states traversed by the test set are relaxed. This pass also identifies relaxed inert and recurrent subsequences. In the second fault simulation pass, boundary conditions for removal of each relaxed inert or recurrent subsequences are examined.

Figure 5A:
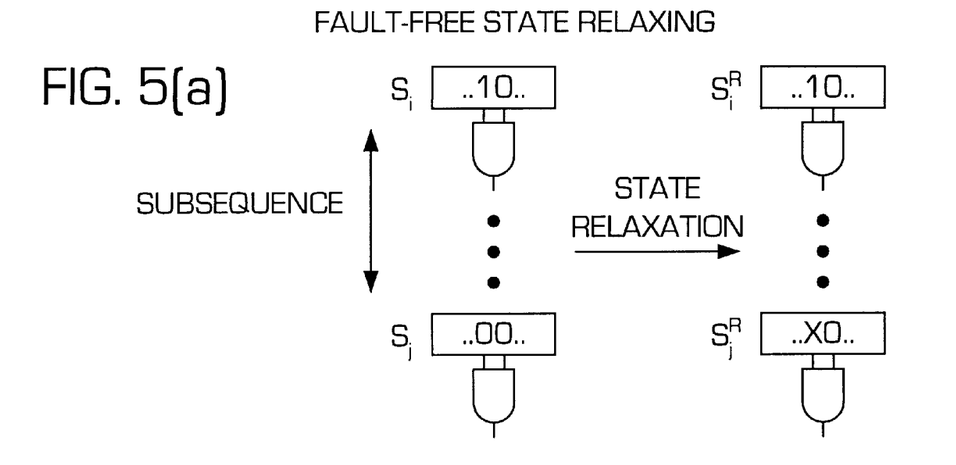
FIG. 5(a) is a diagram showing fault-free state relaxation.
Figure 5B:
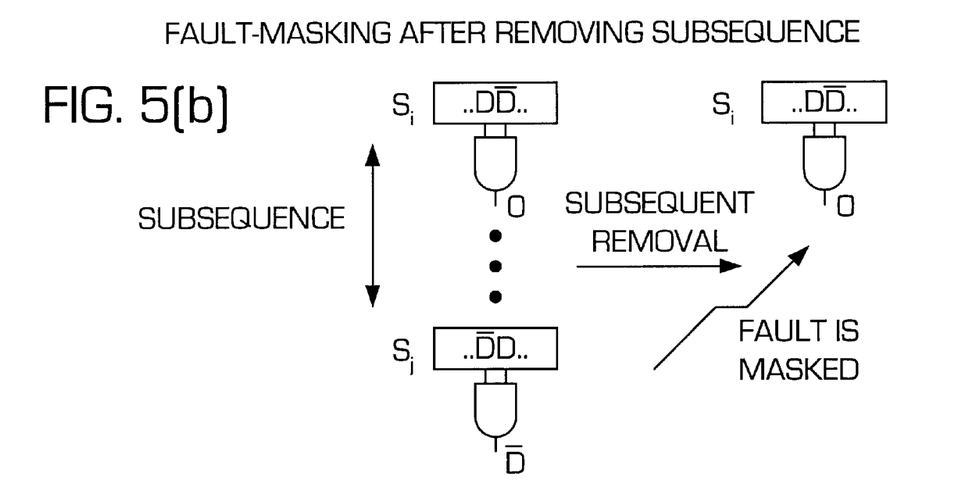
FIG. 5(b) is a diagram showing fault masking after removing a subsequence.

Fault masking can occur within an inert subsequence. It is also possible that a relaxed inert subsequence will mask a fault. Note that a relaxed inert subsequence can mask a fault even when the corresponding inert subsequence does not mask a fault. Consider the example shown in FIGS. 5(a) and 5(b), with the subsequence $T_{sub}$ composed of vectors $V_i \ldots V_j$. A few flip-flop values of interest are shown for states $S_i$ and $S_j$ in FIG. 5(a). Values of these flip-flops in the faulty circuit are shown in FIG. 5(b). A flip-flop value is shown as D ($\overline{D}$) if it assumes a value of 1 (0) in the good circuit, and a value of 0 (1) in the faulty circuit. During fault simulation, assume the two flip-flops in state $S_i$ have fault effects of D and $\overline{D}$, respectively. The AND gate does not exhibit a fault effect since fault effects at the inputs of the AND gate mask each other. However, during the course of simulation of $T_{sub}$, it is possible that both flip-flops have identical fault effects of are resulting in the propagation of the fault effect across the AND gate. In this case, the fault effects are not mask ed by the AND gate, and the fault effect produced at the output of the AND gate may further propagate to a primary output.

Next the state relaxation scenario is considered. Assume that state relaxation of state results in the state $S_j^R$ shown in FIG. 5(a). Removal of the subsequence $T_{subi}$ implies that vectors $V_i \ldots V_{j-1}$ will be removed. Therefore, vector $V_j$ will be applied with a present state of $S_i$ after subsequence removal (FIG. 5(b)). In the modified sequence, no fault effect will appear at the output of the AND gate due to fault masking. Although this situation is rare, the fault coverage after test sequence compaction may be slightly lower due to fault masking.

Figure 6A:
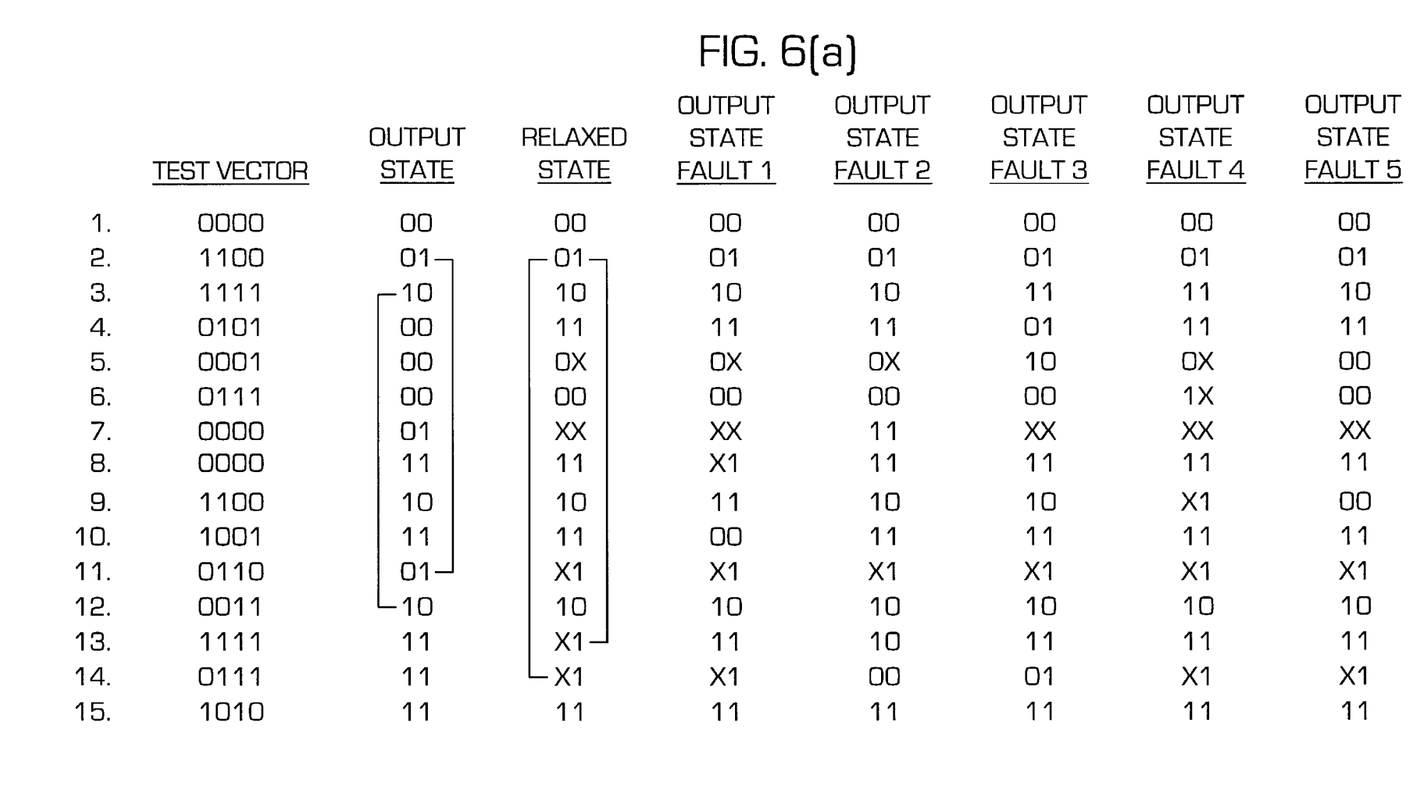
FIG. 6 is a chart showing application of the present invention on a set of test vectors.
Figure 6B:
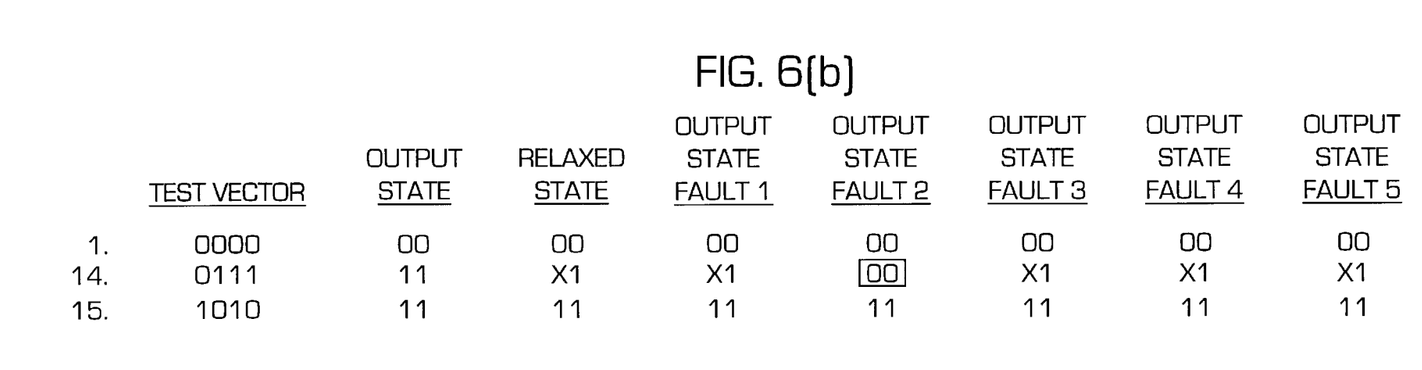
Figure 6C:
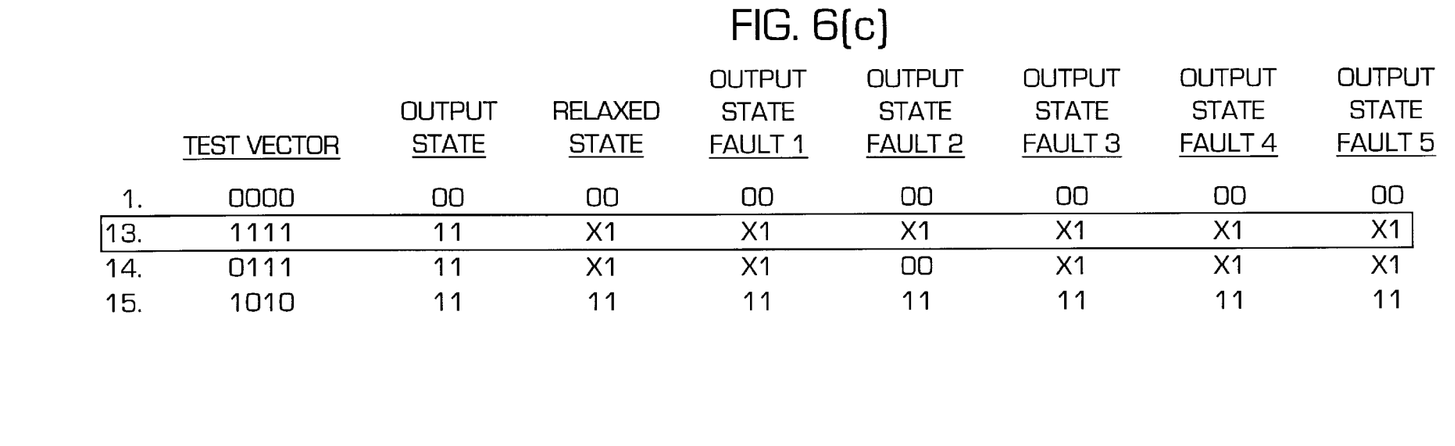

Next a more detailed example of the method will be describe with reference to FIG. 6. Assume that the test set consists of 15 test vectors (Part A). The Output State column reflects the primary output of a fault-free machine after each test vector has been applied. Note that test vectors 3 through 12 represent a recurrent subsequence because the output state of the machine is the same after application of both test vectors 3 and 12. Note that test vectors 2 through 11 are also a recurrent subsequence.

The first step is to relax the output states. The Relaxed State column shows the results of the relaxation. The next step is to identify candidate subsequences for removal by identifying relaxed recurrent subsequences. One such subsequence comprises test vectors 2 through 14. Note that relaxation has allowed a larger candidate subsequence to be identified.

The boundary conditions of this candidate subsequence must now be examined to see if it can be removed. First, test vectors 2 through 13 are removed from the test set as shown in part B. Then fault simulations are performed for all identified faults (5 in this example) and the output states are relaxed. If the application of test vector 14 creates the same output state for each fault as the machine with no faults (the relaxed state column), the boundary conditions are met and the candidate subsequence can be removed permanently from the set of test vectors. However, as shown in Part B, application of test vector 14 with fault 2 creates a different output state (00).

This does not mean that the subsequence cannot be removed, however, further analysis is required. The subsequence can still be removed if fault 2 is found by another subsequence of test vectors or if fault 2 would never be found by any of the test vectors in the set. Note that nearly all test vector sets will not detect all faults in a machine. If neither of these conditions are met, the candidate subsequence cannot be removed and the next candidate subsequence is analyzed.

In this example, another candidate subsequence comprises test vectors 2 through 13. Part C shows the results of fault simulation after test vectors 2 through 12 have been removed. Note that after fault simulation, application of test vector 14 creates the same output state as the machine with no faults (the relaxed state column). Therefore, the boundary conditions are met and the candidate subsequence can be removed permanently from the set of test vectors.

This process continues until all candidate subsequences have been examined.

Experimental Results

The relaxed recurrent subsequence algorithm was implemented in C. ISCAS89 sequential benchmark circuits and several synthesized circuits were used to evaluate the effectiveness of the algorithm. All experiments were performed on a Sun UltraSPARC with 256 MB RAM. Test sets generated by two test generators (HITEC and STRATEGATE) were statically compacted. HITEC is a deterministic test generator for sequential circuits, while STRATEGATE employs genetic algorithms for generating test vectors.

Figure 7:
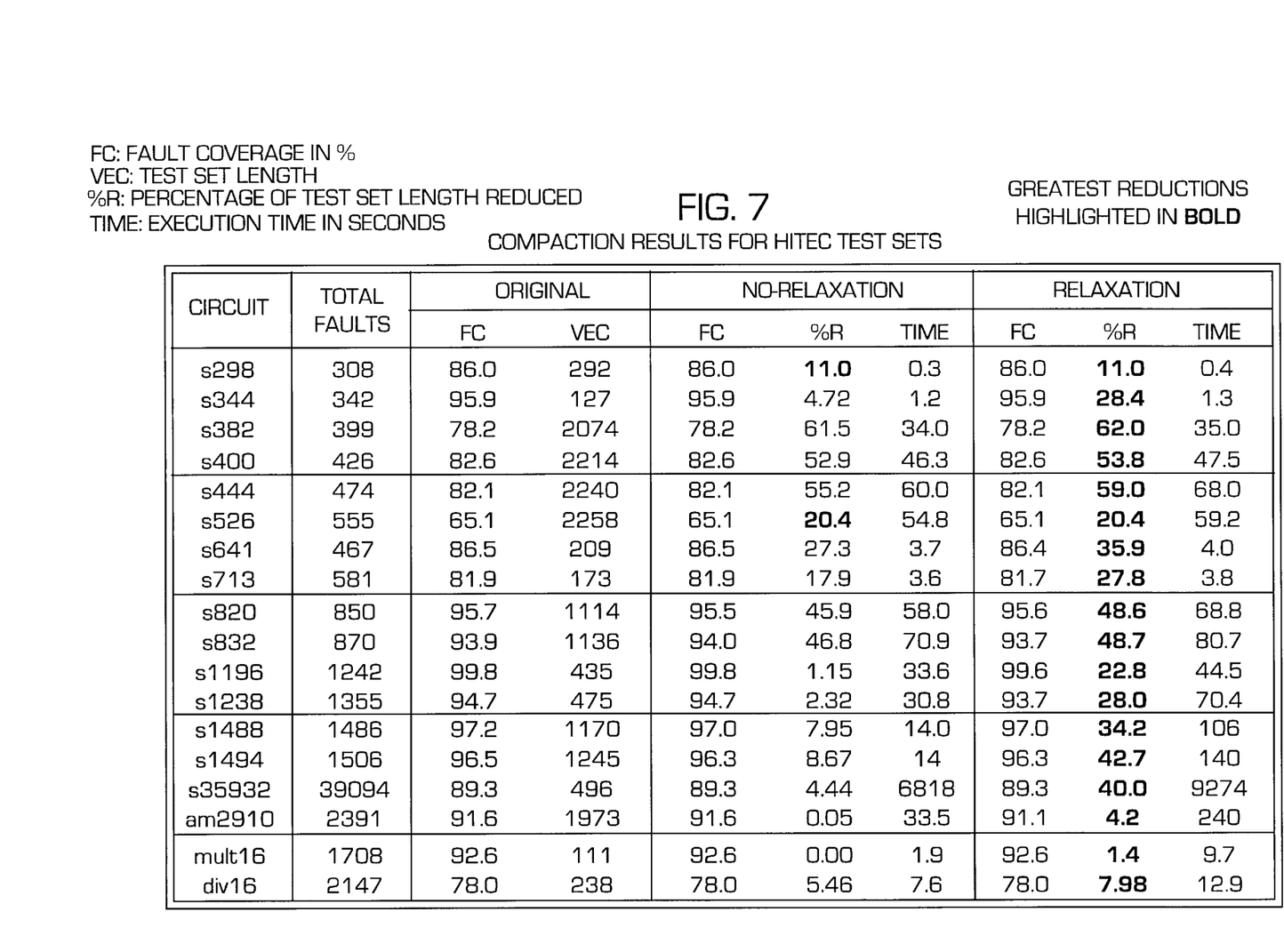
FIG. 7 is a table showing compaction results for HITEC test sets.
Figure 8:
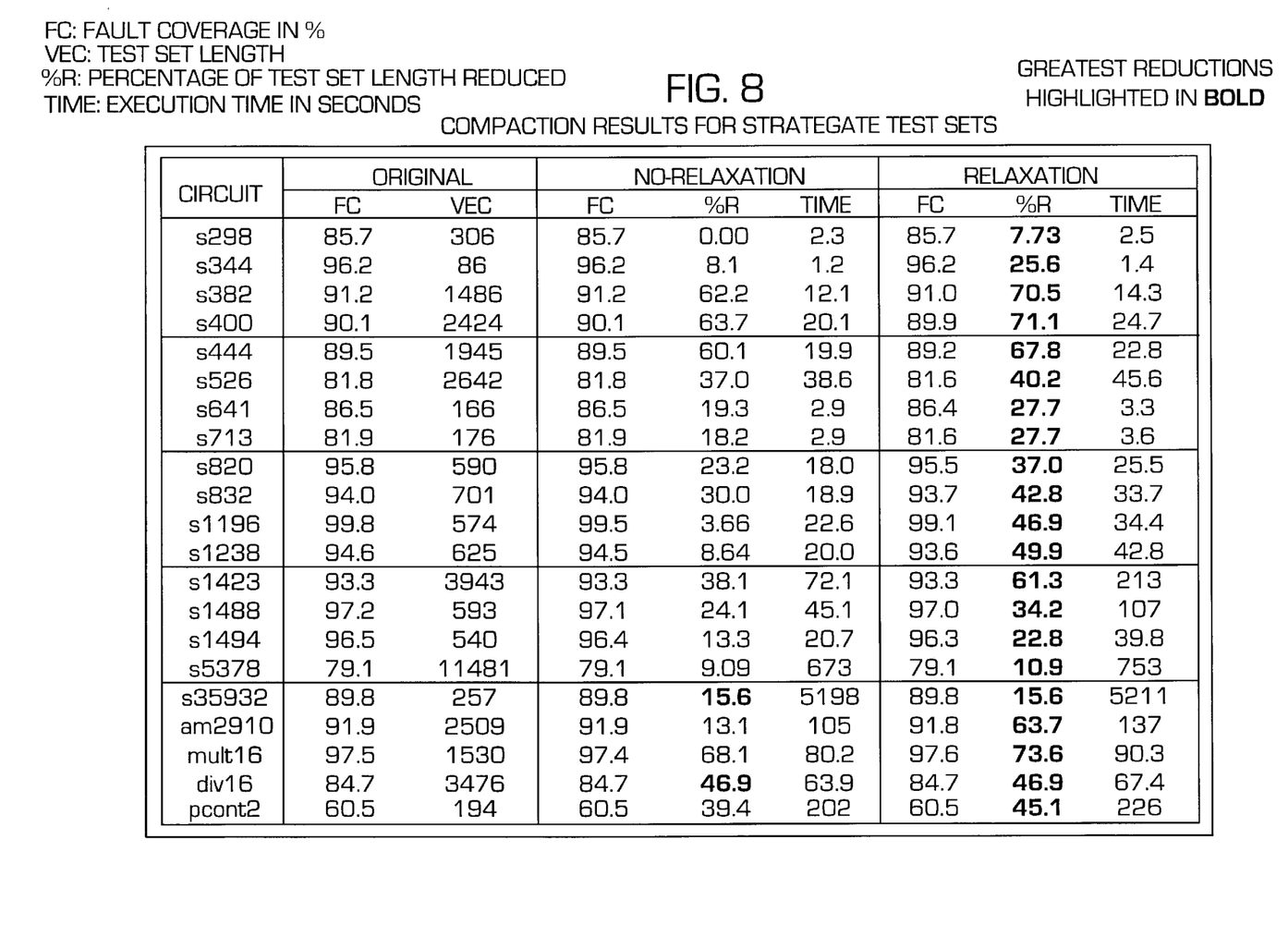
FIG. 8 is a table showing compaction results for STRATEGATE test sets.

The compaction results for HITEC and STRATEGATE test vectors are shown in FIGS. 7 and 8, respectively. The total numbers of faults for the circuits are shown in FIG. 7 only. The original numbers of vectors and fault coverages are shown for each table, followed by the compaction results for the previous approach described in the Hsiao article referred to above, and this invention, including fault coverages after compaction, percent reduction of original test set sizes, and execution times in seconds. The compaction schemes involve the combined approach of inert-subsequence removal followed by the recurrent-subsequence removal for all test sets. The execution times for the relaxed recurrent-subsequence removal algorithm are slightly longer than those for the non-relaxed removal algorithm. This is because of the extra times needed for computing support sets and for considering more candidate subsequences that have become eligible for removal.

For most circuits, a significant reduction in test set size was observed. For instance, in circuits s1488 and s1494, reductions for HITEC test vectors increased from 7.95% to 34.2% and 8.67% to 42.7%, respectively. For s35932, the reductions increased from 4.44% to 40.0%! Similar trends are seen for many other circuits as well. In circuits s1423 and s5378, the original number of vectors in the HITEC test set are small with low fault coverages; thus, they were not considered.

Significant reductions are obtained for the STRATEGATE test vectors, too. For instance, in the s1423 test vectors, the reductions in test set was 23% over the original technique, which already achieved 38.1%, without decrease in fault coverage. In circuits s298 and s344, for instance, the relaxed recurrent-subsequence removal increased test set reductions from 0% to 7.7% and 8.1% to 25.6%, respectively for these two circuits.

Note that some of the compacted test set vectors produced slightly lower fault coverages than those of the original test sets. This is due to the fault masking phenomenon. This problem was also present in the original subsequence removal compaction technique described in Hsiao cited above. Nevertheless, the drop in fault coverages is marginal.

A static test set compaction framework based on relaxed recurrent-subsequence removal has been described. Significant reductions in test set size over previously known techniques are obtained in short execution times. Sufficient conditions for removing subsequences have been identified that begin and end on different fully-specified states, without adversely affecting the fault coverage. As opposed to trial and re-trial based approaches to static compaction, only two fault simulation passes are required in this compaction technique. As a result, large test sets and circuits can be quickly processed by using this technique. Furthermore, the state relaxation technique is a general approach that can also be used to significantly augment many recently proposed static compaction approaches.

While the above is a description of the invention in its preferred embodiments, various modifications and equivalents may be employed. Therefore, the above description and illustration should not be taken as limiting the scope of the invention which is defined by the claims.

What is claimed is:

1. A method for fast static compacting a test set for sequential circuits with finite output states by removing subsequences of test vectors from a vector test set comprising (a) relaxing the output states of said sequential circuits;
   (b) identifying, in response to said step of relaxing a candidate subsequence of test vectors from said vector test set for removal;
   (c) temporarily removing said candidate identified subsequence of test vectors from said vector test set;
   (d) performing fault simulation on remaining test vectors from said vector test set;
   (e) examining, in response to said step of performing fault simulation results against a set of removal criteria;
   (f) permanently removing, in response to said step of examining said temporarily removed candidate subsequence if said set of removal criteria is met;
   (g) replacing, in response to said step of examining said temporarily removed candidate subsequence if said set of removal criteria is not met; and
   (h) repeating steps (a) through (g) until all candidate subsequences of test vectors have been identified.

2. The method of claim 1, wherein the output states of said sequential circuits are relaxed by using derived support sets.

3. The method of claim 2, wherein the support sets are derived in a reverse order.

4. The method of claim 2, wherein the support sets are derived in a forward order.

5. The method of claim 2, wherein the support sets are derived iteratively.

6. The method of claim 1, wherein said set of removal criteria consist of at least one of:

(a) said candidate subsequence is inert;
   (b) faults detected by said candidate subsequence can be detected elsewhere in said set of test vectors; and
   (c) fault effects are the result of faults that cannot be detected by any test vectors in said test set.

* * * * *

UNITED STATES PATENT AND TRADEMARK OFFICE
CERTIFICATE OF CORRECTION

PATENT NO. : 6,145,106
DATED : November 7, 2000
INVENTOR(S) : Srimat Chakradhar, Michael S. Hsiao It is certified that error appears in the above-identified patent and that said Letters Patent is hereby corrected as shown below:

Column 4,
Line 65, delete "th at" insert -- that --

Column 5,
Line 5, delete "re present" insert -- represented --

Column 6,
Line 40, delete "$S_{1+1}$" insert -- $S_{j+1}$ --

Column 7,
Line 12, delete "are" insert -- $\overline{D}$, --;
Line 14, delete "mask ed" insert -- masked --;
Line 19, delete "$T_{subi}$" insert -- $T_{sub}$ --;

Column 9,
Line 21, delete "candidate identified" insert -- identified candidate --

Signed and Sealed this

Thirtieth Day of October, 2001

Attest:

NICHOLAS P. GODICI
Attesting Officer
Acting Director of the United States Patent and Trademark Office